United States Patent

Chan et al.

[11] Patent Number: 5,872,731
[45] Date of Patent: Feb. 16, 1999

[54] MULTI-STATE JOSEPHSON MEMORY

[75] Inventors: Hugo W-K. Chan; Arnold H. Silver, both of Rancho Palos Verdes; Robert D. Sandell, Manhattan Beach, all of Calif.

[73] Assignee: TRW Inc., Redondo Beach, Calif.

[21] Appl. No.: 948,570

[22] Filed: Oct. 10, 1997

[51] Int. Cl.$^6$ .................................................. G11C 11/44
[52] U.S. Cl. ......................... 365/162; 257/36; 505/832; 365/160
[58] Field of Search .................................. 365/160, 162; 257/31, 36; 505/190, 832

[56] References Cited

U.S. PATENT DOCUMENTS

| | | | |
|---|---|---|---|
| 4,785,426 | 11/1988 | Harada et al. | 365/162 |
| 5,229,962 | 7/1993 | Yuh et al. | 365/162 |
| 5,260,264 | 11/1993 | Kurosawa et al. | 505/1 |
| 5,295,093 | 3/1994 | Nagasawa | 365/162 |
| 5,610,857 | 3/1997 | Nandakumar | 365/162 |

*Primary Examiner*—Son Mai
*Attorney, Agent, or Firm*—Michael S. Yatsko

[57] ABSTRACT

A multi-state Josephson memory in a superconductor integrated circuit includes a plurality of superconductive quantum interference device (SQUID) memory cells 2 each having a SQUID 4 characterized by a SQUID loop inductance L and a junction critical current $I_c$, which determine the number of memory states that can be stored in the SQUID 4. A gate current $I_g$ is transmitted to the superconductive inductors 6 and 8 of the SQUID 4 to perform a read operation by crossing a designated number of current threshold boundaries corresponding to the memory state stored in the SQUID, so that the Josephson junction 12 of the SQUID 4 generates a number of pulses corresponding to the memory state. A control current $I_{con}$ writes data to the SQUID 4 through a control current input 16, and is preferably magnetically coupled to the SQUID 4 through superconductive inductor pairs 18, 6 and 20, 8. In a preferred embodiment, a plurality of SQUID memory cells 70a, 70b, . . . 70f are arranged in a plurality of columns and rows with column select inputs 72, 74 and row select inputs 76, 78 and 80. Digital-to-analog converters 86 and 88 are preferably provided to convert a binary digital input into the analog control current $I_{con}$, the magnitude of which is designed to cross a number of current threshold boundaries corresponding to the digital input. A plurality of single flux quantum counters 112 and 114 are preferably connected to count the number of Josephson pulses from the SQUID memory cells 70a, 70b, . . . 70f to generate a count of the pulses as the memory output. In a preferred embodiment, the memory outputs from the single flux quantum counters 112 and 114 are fed back into the input digital-to-analog converters 86 and 88, respectively, to form a non-destructive readout.

29 Claims, 3 Drawing Sheets

MULTI-STATE JOSEPHSON MEMORY

BACKGROUND

The present invention relates to a multi-state Josephson memory in a superconductor integrated circuit, and in particular, to a multi-state Josephson memory with a plurality of superconducting quantum interference devices (SQUIDs).

Superconductor digital integrated circuits have shown a significant potential for high speed supercomputers, digital signal processors, high performance network switches, and analog-to-digital converters in a variety of defense and commercial applications. At the present time, a major performance limitation on high performance computing with superconductor integrated circuits is the absence of a high performance, high density superconductor memory. A conventional superconductor integrated circuit memory has a SQUID Josephson junction memory cell that stores a single flux quantum to represent a binary digit. For example, the presence or the absence of a flux quantum can be regarded as to denote a "1" or "0" signal of a binary digit, respectively. Therefore, a conventional Josephson memory can store, at most, one binary digit per SQUID.

With existing superconductor integrated circuit fabrication technology, the scale of integration of a conventional binary Josephson junction memory is very limited. An example of a high density superconductor memory known to date using Josephson junction technology is a 4-kilobit non-volatile static random access memory (SRAM). Further development to increase the scale of integration to fabricate a 16–64 kilobit memory by using sub-micron lithography with the existing superconductor processing technology significantly increases the difficulty of fabrication. Process maturity and memory cell operation margin has made the fabrication of a higher density memory with a sufficiently acceptable yield technically very challenging. The 4-kilobit non-volatile SRAM, the highest density superconductor memory known to date, is not yet fully operational due to yield limiting hard defects. Sub-micron device scaling of SQUID Josephson junction circuits would lower the yield even further as it takes more time to develop a mature process technology to provide sufficient uniformity and operational margin for a circuit layout with a large scale integration. The lack of a mature fabrication process at the present time significantly increases the production cost of a conventional high density superconductor memory with each SQUID storing only one binary digit.

Therefore, there is a need for a higher density superconductor memory that is capable of storing more information on a single memory chip for a given chip size with a scale of integration that is readily achievable by existing superconductor integrated circuit fabrication technology.

SUMMARY OF THE INVENTION

The present invention satisfies this need. In view of the above problems, the present invention provides a multi-state Josephson memory that is capable of storing multiple memory states in a single SQUID memory cell. The number of memory states that can be stored in a SQUID memory cell is limited by the SQUID loop inductance L, the junction critical current $I_c$, and the single flux quantum $\phi_0$, which is a physical constant. The number of memory states corresponds to the number of bits of information that can be stored in a single SQUID. In accordance with the present invention, the superconductor multi-state Josephson memory generally comprises:

(a) A superconductive quantum interference device (SQUID) memory storage capable of storing data in N memory states. The SQUID memory storage characterized by a loop inductance L and a junction critical current $I_c$ and having a plurality of current threshold boundaries, the maximum number of memory states N equal to the maximum number of current threshold boundaries having an upper limit of $LI_c/\phi_0$, wherein $\phi_0$ is a constant representing the magnetic flux of a single flux quantum;

(b) a control input connected to couple a control current to the SQUID memory storage to write digital input data as a memory state in the SQUID memory storage, the control current capable of being increased until n current threshold boundaries are crossed, n being an integer within the range of 0 to N−1 and representing the memory state of the data to be written, the control current then removed so that the SQUID memory storage supports a circulating current corresponding to n single flux quanta; and (c) a gate connected to conduct a gate current to the SQUID memory storage, the gate current capable of being increased across the n current threshold boundaries to generate n pulses corresponding to the n single flux quanta, n representing the memory state of the data in the SQUID memory storage to be read in response to the gate current.

In a preferred embodiment, the multi-state Josephson memory comprises a plurality of memory cells arranged in a plurality of rows and columns, each cell having a unique address identified by a particular column select input and a particular row select input. To write data to the SQUID memory storage by setting the SQUID to a desired memory state, the multi-state Josephson memory preferably comprises a digital-to-analog converter that converts a digital input into an analog control current, the magnitude of which is directly proportional to the magnitude of the digital input. The control current crosses the n current threshold boundaries to set the SQUID memory storage to the desired memory state.

In a preferred embodiment, the multi-state Josephson memory further comprises a single flux quantum counter connected to count the number of pulses from the SQUID memory storage to generate a digital output in response to a read signal supplied by the gate current, the number of single flux quantum pulses corresponding to the memory state of stored data in the SQUID memory storage. To form a non-destructive readout memory, it is further preferred that the memory output from the single flux quantum counter be fed back to the input digital-to-analog converter to regenerate the memory state in the SQUID memory storage.

Advantageously, the present invention provides a multi-state Josephson memory with each SQUID memory cell capable of storing data in a plurality of memory states. The plurality of memory states within each SQUID memory cell significantly increases the amount of information that can be stored in a superconductor memory with a limited number of SQUID memory cells. For a SQUID memory cell with N memory states, each SQUID cell is capable of storing $\log_2 N$ bits of information. Therefore, the present invention multiplies the memory capacity of a superconductor integrated circuit memory by a factor of $\log_2 N$ without significantly increasing the density or the area of the integrated circuit.

BRIEF DESCRIPTION OF THE DRAWINGS

These and other features, aspects, and advantages of the present invention will become understood with reference to the following description, appended claims, and accompanying drawings where:

DETAILED DESCRIPTION OF THE PREFERRED EMBODIMENTS

The present invention provides a superconductor multi-state Josephson memory comprising a plurality of superconductive quantum interference device (SQUID) memory cells, each memory cell having a gate current input and a control current input carrying a gate current and a control current, respectively, to cross a designated number of current threshold boundaries, which represent the memory state of the SQUID memory storage. The control current and the gate current perform the write operation and the read operation of the memory cell. The maximum number of memory states of the SQUID memory storage is equal to the maximum number of current threshold boundaries, which is limited by the SQUID loop inductance and the Josephson junction critical current. The memory cells are preferably arranged in a plurality of rows and columns, with each memory cell uniquely addressed by a particular column select input and a particular row select input. It is preferred that a digital input be converted to the gate current by a digital-to-analog converter, which generates the gate current in direct proportion to the magnitude of the digital input. It is further preferred that the output of the SQUID memory storage be connected to a single flux quantum counter, which counts the number of Josephson junction pulses representing the memory state of the SQUID.

Figure 1:
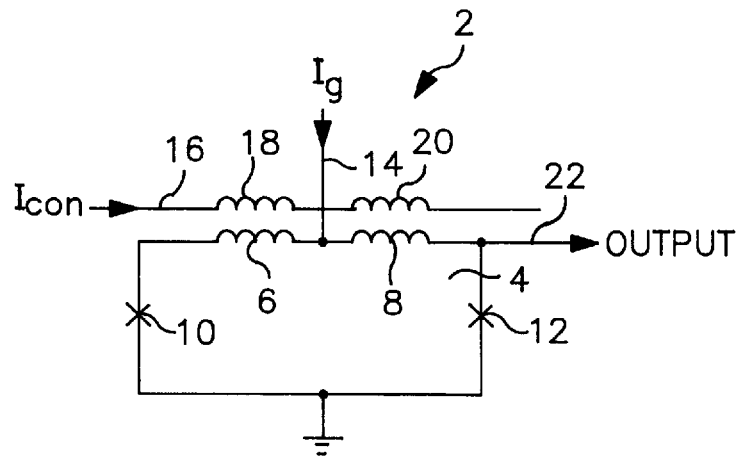
FIG. 1 is a circuit diagram of a magnetically coupled SQUID memory cell with a control current input, a gate current input, and a Josephson pulse output.

FIG. 1 shows a circuit diagram of a SQUID memory cell 2 having a SQUID 4 as a memory storage. The SQUID 4 includes superconductive inductors 6 and 8 connected to a pair of Josephson junctions 10 and 12, respectively. The Josephson junction 10, the inductors 6 and 8, and the Josephson junction 12 are connected in series forming a loop, wherein the ends of the Josephson junctions 10 and 12 opposite the inductors 6 and 8 are connected to ground. The SQUID memory storage 4 has a gate 14 connected to the inductors 6 and 8 to conduct a gate current $I_g$ to the SQUID. A control input 16 is connected to conduct a control current $I_{con}$ to the SQUID memory storage 4 through two superconductive inductors 18 and 20 connected in series. The inductors 18 and 20 and the inductors 6 and 8 of the SQUID 4 are respectively positioned as inductor pairs to form current transformers. The control current $I_{con}$ is magnetically coupled to the SQUID memory storage 4 through the inductor pairs 18, 6 and 20, 8. Although the control current can be directly coupled to the SQUID memory storage 4, for example, through a line input to the conductive portion of the SQUID loop between the inductor 6 and the Josephson junction 10, it is preferred that the control current be magnetically coupled to the SQUID through current transformers to provide isolation for the control current input line 16. The Josephson junctions 10 and 12 each produce a series of pulses when the gate current $I_g$ is applied to the SQUID 4, and one of the Josephson junctions 12 is connected to a pulse output 22. Alternatively, the pulse output can be provided by the other Josephson junction 10.

A SQUID has characteristics of a loop inductance L and a Josephson junction critical current $I_c$. The loop inductance of the SQUID 4 as shown in FIG. 1 is the total inductance value of the superconductive inductors 6 and 8. The junction critical current $I_c$ is the minimum current necessary for setting the Josephson junctions 10 and 12 in an operating voltage state. In the multi-state Josephson junction memory according to the present invention, the SQUID memory storage 4 performs memory storage operations below the junction critical current $I_c$.

A SQUID has a number of current threshold boundaries below the junction critical current $I_c$. The maximum number of current threshold boundaries of a SQUID is limited by the loop inductance L and the Josephson junction critical current $I_c$, with the relationship $$N \leq LI_c/\phi_0,$$

wherein $\phi_0$ is the magnetic flux of a single flux quantum, which is a physical constant equal to $2 \times 10^{-15}$ V·s. The magnitude of the loop inductance L and the junction critical current $I_c$ are fixed parameters once the SQUID is fabricated, and can be set to specified numbers by designing the physical layout of the SQUID, the process of which is known to a person skilled in the art. The SQUID is capable of storing a plurality of memory states, the maximum number of which is equal to the maximum number of current threshold boundaries N.

Figure 2:
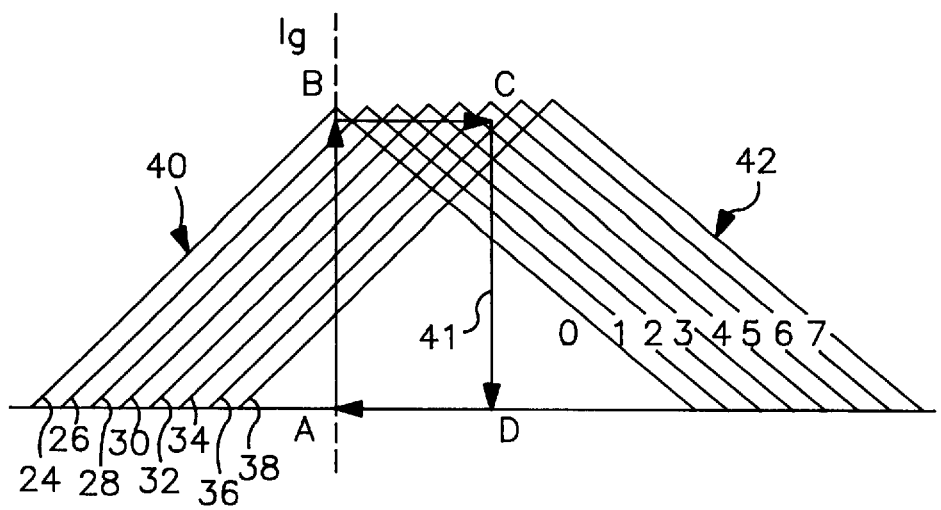
FIG. 2 is a plot of a gate current ($I_g$) v. control current ($I_{con}$) curve for a SQUID memory storage with eight memory states showing a typical loop of gate current and control current changes for read and write operations.

FIG. 2 is a plot illustrating an example of a gate current v. control current ($I_g$ v. $I_{con}$) for the memory cell of FIG. 1, wherein the SQUID memory storage 4 has eight current threshold boundaries capable of supporting up to eight memory states. The eight current threshold boundaries 24, 26, 28, 30, 32, 34, 36 and 38 are each triangular shaped on the $I_g$ v. $I_{con}$ plot and are staggered from each other along the $I_{con}$ axis. The current threshold boundaries 24, 26, ... 38 correspond to memory states 0, 1, ... 7, with 0 being the smallest number and 7 being the largest number stored in the SQUID memory storage with eight memory states. Each current threshold boundary has a rising portion 40 and a falling portion 42. To perform the read and write operations by the memory cell of FIG. 1, the gate current $I_g$ and the control current $I_{con}$ are applied to the SQUID memory storage 4 in a sequential loop 41 identified by path lines A→B, B→C, C→D, and D→A as shown in FIG. 2.

At point A, neither the gate current $I_g$ nor the control current $I_{con}$ is applied to the SQUID memory storage. However, because the SQUID loop formed by the Josephson junctions 12 and 10 and the inductors 6 and 8 in FIG. 1 are superconductive, the SQUID 4 is capable of supporting a current circulating within that loop without any externally applied current or voltage. In the plot shown in FIG. 2, it is assumed that the SQUID memory storage initially has a circulating loop current of a magnitude representing the memory state 5. When the gate current $I_g$ is applied to the SQUID gate 14, $I_g$ cuts across five current threshold boundaries as illustrated by the line A→B in FIG. 2, while no control current $I_{con}$ is applied to the memory cell. Each time the gate current crosses one of the current threshold boundaries 26 ... 38, the Josephson junction 12 generates a pulse to the output 22. In this example, there are a maximum possible of seven pulses generated by the Josephson junction 12 as the gate current is increased while the control current is held constant. The line A→B represents a read operation, with the number of Josephson pulses representing the memory state of the SQUID memory storage. The five pulses generated at the Josephson junction output 22 in FIG. 1 represents memory state 5. After the pulses are generated by the Josephson junction 12 in response to the crossing of the current threshold boundaries by the gate current $I_g$, the memory state previously stored in the SQUID is flushed out. Therefore, the SQUID memory cell of FIG. 1 is a destructive read out memory, that is, a memory that no longer stores the information once it is read.

The write operation of the memory cell is performed by increasing the control current $I_{con}$ so that it crosses a designated number of current threshold boundaries while holding the gate current $I_g$ constant, as illustrated by the path B→C. The path B→C as illustrated in FIG. 2 crosses five current threshold boundaries and ends at point C, which represents memory state 5 stored in the SQUID memory storage. Each time the control current $I_{con}$ crosses a current threshold boundary on the path B→C, the memory state of the SQUID is increased by one. In the plot shown in FIG. 2, the memory state of the SQUID memory storage is set at memory state 5. The gate current $I_g$ is then removed while the control current $I_{con}$ is held constant, as illustrated by the path C→D shown in FIG. 2. The memory state of the SQUID memory storage remains the same at point D as at point C. The control current $I_{con}$ is then removed while the gate current $I_g$ is held at 0 as illustrated by the path D→A. At this time at point A, neither the gate current nor the control current is supplied to the SQUID 4, but the SQUID supports a circulating current within the SQUID loop, with the magnitude of the circulating current corresponding to n flux quanta, n being an integer in the range of 0 to N−1 and representing the memory state of the SQUID memory storage. N is the maximum number of memory states that can be stored in a SQUID with the relationship $N \leq LI_c/\phi_0$ described above, and is preferably $2^m$, wherein m is a positive integer representing the number of bits of information that can be stored by a single SQUID memory cell.

Returning to FIG. 2, the new memory state at point A after a complete loop 41 now represents a stable memory state 5 without any gate current or control current applied to the SQUID. The current threshold boundaries 24, 26, . . . 38 are shifted relative to the loop A→B→C→D→A, such that when a subsequent read operation is performed on the SQUID by increasing the gate current $I_g$ following the path A→B, exactly five current threshold boundaries are crossed. In response to the gate current $I_g$, the SQUID Josephson junction 12 transmits exactly five pulses at the SQUID memory output 22, thereby signifying that memory state 5 is being read out.

The SQUID memory storage 4 can be designed with an arbitrary SQUID loop inductance L and an arbitrary junction critical current $I_c$, to support an arbitrarily maximum number of memory states that can be stored in the SQUID. With existing superconductor integrated circuit fabrication technology, it is preferred that the maximum number of memory states N be no more than 16, which is equivalent to a storage of four bits per SQUID memory cell. However, the present invention is applicable to Josephson memories of any number of multiple memory states.

Advantageously, the number of memory states N can be set to represent any number of digits of any numbering system. For binary digits, N is preferably $2^m$, wherein m is a positive integer. To represent octal numbers, N is prefer-ably $8^m$. Similarly, N is preferably set at $16^m$ to represent hexadecimal numbers. As superconductor integrated circuit fabrication technology advances, more memory states can be stored in a single SQUID without ambiguities in resolving closely spaced current threshold boundaries.

Figure 3:
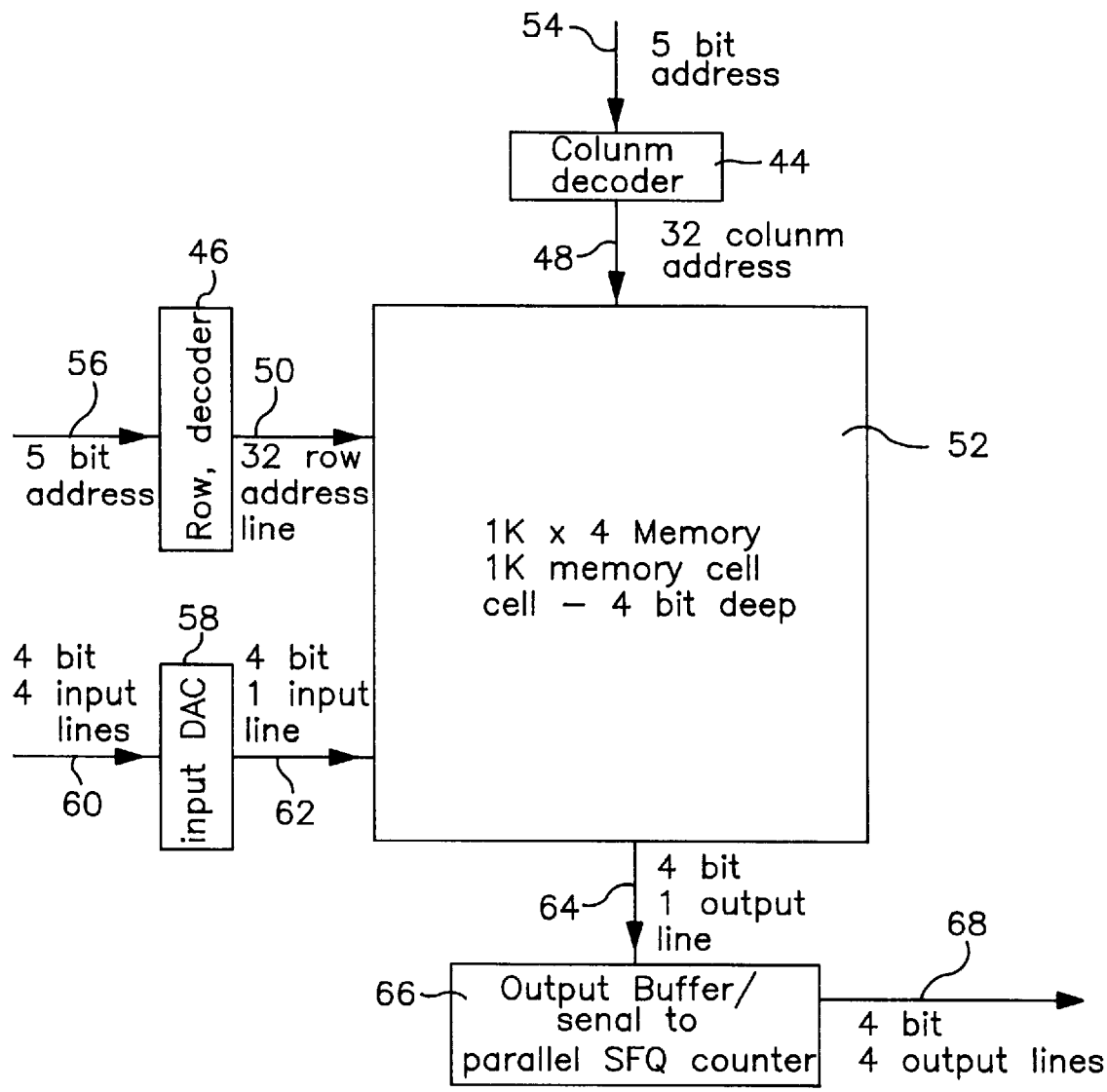
FIG. 3 shows a simplified block diagram of a multi-state Josephson memory with an input digital-to-analog converter and an output single flux quantum counter in accordance with the present invention.

FIG. 3 shows a simplified block diagram illustrating a preferred embodiment of the present invention with inputs and outputs for a 4-kilobit memory, with four bits per memory cell. For the purpose of this description, the prefix "kilo-" denotes a unit of 1,024 in conformity with standard terminology for binary digits. The multi-state Josephson memory includes a plurality of column select inputs denoted by the arrow 48 and a plurality of row select inputs denoted by the arrow 50. For a 4-kilobit memory 52 with 1,024 memory cells each storing four bits of information, it is preferred that the memory cells be arranged in an array of 32 columns by 32 rows. A column decoder 44 is preferably provided to convert a 5-bit column addressing signal into $2^5=32$ column select inputs, each column connected to address a respective column of the memory cells within the memory 52. Similarly, a row decoder 46 is preferably provided to convert a 5-bit row addressing signal 56 into the parallel 32 rows of row select inputs 50, with each row select input connected to address a respective row of memory cells. Each memory cell within the memory 52 has a unique address identified by a particular column select input and a particular row select input.

Because the memory state of a SQUID memory storage depends upon the number of current threshold boundaries crossed by the control current $I_{con}$ on the path B→C shown in FIG. 2 during a read operation, the control current $I_{con}$ is an analog current with a magnitude directly proportional to the memory state that is to be stored in the memory cell. In FIG. 3, an input digital-to-analog converter 58 is preferably provided to convert a 4-bit digital input 60 into a single analog input line 62 carrying a control current $I_{con}$ with a magnitude directly proportional to the magnitude of the digital input from line 60, and to the corresponding number of current threshold boundaries to be crossed to set the SQUID memory storage to a designated memory state representing the digital input. During a read operation, a SQUID memory storage outputs a number of pulses exactly equal to the memory state stored in the SQUID through an output line 64. A single flux quantum counter 66 is preferably provided to count the number of pulses from the output line 64 to generate a digital output 68 representing the count of the pulses. In the preferred embodiment shown in FIG. 3, the digital memory output 68 has four parallel output lines for the four bits, while the output line 64 from the SQUID memory cells 52 carries the pulses in a single serial line. Therefore, the single flux quantum counter 66 is preferably provided with an output buffer to convert the serial pulse outputs from the line 64 to the 4-bit parallel digital output 68.

Figure 4:
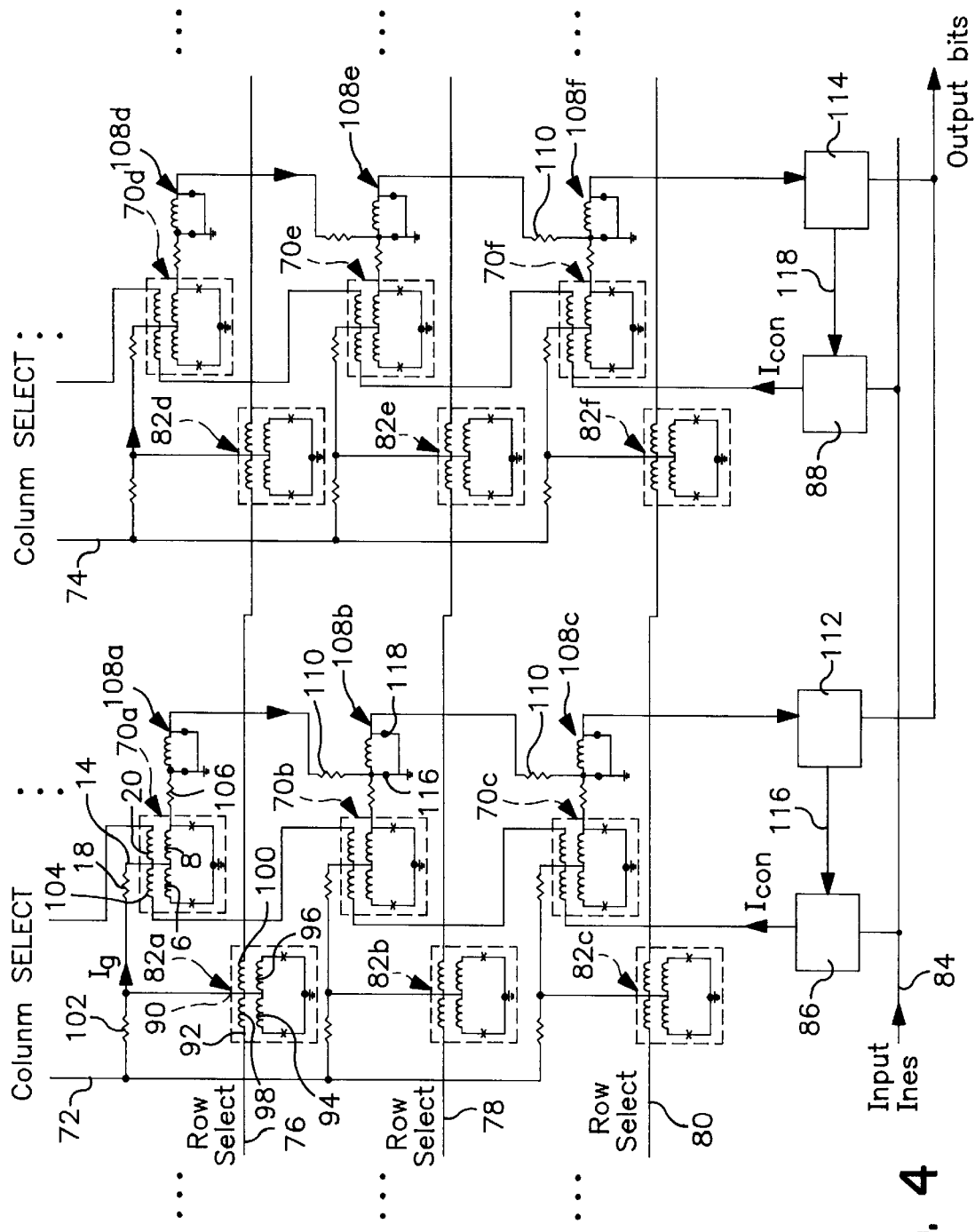
FIG. 4 is a circuit diagram showing a preferred embodiment of the present invention with a plurality of SQUID memory cells arranged in a plurality of rows and columns.

FIG. 4 is a detailed circuit diagram showing a preferred embodiment of the multi-state Josephson junction of FIG. 3 with a plurality of memory cells addressed by respective column select inputs and row select inputs. Six representative memory cells 70a, 70b, . . . 70f arranged in two columns and three rows are shown in FIG. 4, with two column select inputs 72 and 74 and three row select inputs 76, 78 and 80. The column select inputs and the row select inputs carry memory addressing signals to a plurality of switches 82a, 82b, . . . 82f, which are connected to the SQUID memory cells 70a, 70b, . . . 70f, respectively. In a superconductor integrated circuit, the switches 82a, 82b, . . . 82f are preferably SQUID switches. It is further preferred that the column select inputs be coupled to the SQUID switches as gate currents and the row select inputs be magnetically coupled to the SQUID switches. Each memory cell has a unique address identified by a particular row select input and a particular column select input. Each SQUID switch, upon receiving addressing signals from its corresponding column select input and row select input, activates its corresponding memory cell. For example, with addressing signals from the column select input 74 and the row select input 78, the SQUID switch 82e activates its corresponding memory cell 70e.

In a preferred embodiment, the digital input data are transmitted through parallel input lines indicated by line 84 to a plurality of digital-to-analog converters 86 and 88, with one digital-to-analog converter for each column of memory cells. The digital-to-analog converters convert the digital input into an analog current having magnitude directly proportional to the magnitude of the digital input, and this current is the control current $I_{con}$ that is fed to the control current inputs of the SQUID memory storages. The control current $I_{con}$ with a magnitude directly proportional to the digital input data crosses a number of current threshold boundaries as indicated by the path B→C in FIG. 2 to set the SQUID memory storage to a designated memory state representing the input data. For example, if the input lines 84 carry four bits and the input is 1010, the input digital-to-analog converters 86 and 88 decode the input data as 10 for the memory state, assuming that the SQUID memory storages are each capable of handling a maximum of 16 memory states, from memory state 0 to memory state 15. For example, when memory cell 70c is selected by the row select input 80 and the column select input 72 for writing the input data, the control current $I_{con}$ from the digital-to-analog converter 86 induces 10 flux quanta into the SQUID memory cell 70c. Each of the SQUID memory cells 70a, 70b, . . . 70f, has a configuration identical to the circuit of FIG. 1, and the control current $I_{con}$ is preferably magnetically coupled to the individual cells through inductor pairs 6,18 and 8, 20 as in FIG. 1. To simplify the memory circuit, only one digital-to-analog converter is provided for each column of memory cells, with the control line inductors 18 and 20 of each memory cell connected in series to receive the control current $I_{con}$ from the respective digital-to-analog converter.

In a preferred embodiment, the SQUID switches 82a, 82b, . . . 82f each have a gate input and a control line input 92. The control line input 92 is connected to a respective row select input and magnetically couples the addressing signal from the row select input to the SQUID switch through pairs of superconductive inductors 94, 98 and 96, 100. The gate input 90 of each SQUID switch is connected to a respective column select input through a resistor 102. The SQUID switches 82a, 82b, . . . 82f each have a physical configuration similar to the SQUID memory cell shown in FIG. 1, but does not perform the function of memory storage.

The gate current $I_g$, which controls the reading operation of a memory cell, is preferably controlled by a column select input upon activation by the corresponding SQUID switch. The gate 90 of the SQUID switch is connected to the gate 14 of the SQUID memory storage through a resistor 104. During a read operation, the gate current $I_g$ is transmitted to the gate 14 of the SQUID memory storage through the resistor 104, with the gate current crossing a number of current threshold boundaries corresponding to the memory state stored in the SQUID memory storage, as indicated by the path A→B in FIG. 2.

The output of pulses from a Josephson junction of each SQUID memory storage is preferably transmitted through a resistor 106 to a SQUID isolator-repeater 108, which repeats the pulse output from its corresponding SQUID memory storage while protecting it from reflected output signals. In a preferred embodiment, the pulse outputs of the SQUID memory cells 70a, 70b, . . . 70f are connected to the SQUID isolator-repeaters 108a, 108b, . . . 108f, with the SQUID isolator-repeaters for the same column of memory cells connected in series with isolating resistors 110 connected between adjacent SQUID isolator-repeaters. The columns of isolator-repeaters 108a, 108b, 108c and 108d, 108e, 108f are connected to output single flux quantum counters 112 and 114, respectively. The output pulse from any particular SQUID isolator-repeater transmits only in the direction toward the corresponding output single flux quantum counter through the series of succeeding SQUID isolator-repeaters within the same column, and the output pulse signals are prevented by the SQUID isolator-repeaters from entering the Josephson junctions of any of the SQUID memory storages within the column. For example, the output pulses from the SQUID memory cell 70a is repeated by the SQUID isolator-repeater 108a, which transmits the pulse to the Josephson junction 116 of the SQUID isolator-repeater 108b. The SQUID isolator-repeater 108b repeats the pulses at its second Josephson junction 118 and transmits the pulses further down the column to the SQUID isolator-repeater 108c, which repeats the output pulses to the single flux quantum counter 112. The single flux quantum counters 112 and 114 preferably each have an output buffer and a serial-to-parallel converter to convert the counts of the number of pulses from the respective columns of SQUID memory cells into parallel bits as indicated in FIG. 3. If serial outputs are desirable, then the serial-to-parallel conversion is not necessary.

In a preferred embodiment for a multi-state Josephson memory with non-destructive readout, the digital output bits from the single flux quantum counters 112 and 114 are fed back into the input digital-to-analog converters 86 and 88 through feedback lines 116 and 118, respectively. The digital-to-analog converters then repetitively transmit a control current $I_{con}$ to the corresponding SQUID memory cells so that they maintain their previous memory states until new input data are written into the memory cells to override the previously stored memory state. Non-destructive readouts are desirable in some memory applications.

The present invention is not limited to the preferred embodiment shown in FIG. 4 and described above. For example, instead of SQUID switches 82a, 82b, . . . 82f, other conventional digital switches known to a person skilled in the art can be used to activate the individual memory cells in response to addressing signals from the corresponding row select inputs and column select inputs. As another example, the SQUID isolator-repeaters 108a, 108b, . . . 108f need not be used if there is a single flux quantum counter connected to the output of each of the SQUID memory cells.

Although the present invention has been described in considerable detail with reference to certain preferred versions thereof, other versions are possible. It is intended to cover all modifications, alternatives and equivalents which may fall within the spirit and scope of the invention as defined in the appended claims.

What is claimed is:

1. A superconductor multi-state Josephson memory comprising a memory cell capable of storing multiple bits, the memory cell comprising:

(a) a superconductive quantum interference device (SQUID) memory storage capable of storing data in N memory states, the SQUID memory storage characterized by a loop inductance L and a junction critical current $I_c$ and having a plurality of current threshold boundaries, the maximum number of memory states N equal to the maximum number of current threshold boundaries having an upper limit of $LI_c/\phi_0$, wherein $\phi_0$ is a constant representing the magnetic flux of a single flux quantum;

(b) a control input connected to couple a control current to the SQUID memory storage to write digital input data as a memory state in the SQUID memory storage, the control current capable of being increased until n current threshold boundaries are crossed, n being an integer within the range of 0 to N−1 and representing the memory state of the data to be written, the control current then removed so that the SQUID memory storage supports a circulating current corresponding to n single flux quanta; and (c) a gate connected to conduct a gate current to the SQUID memory storage, the gate current capable of being increased across the n current threshold boundaries to generate n pulses corresponding to the n single flux quanta, n representing the memory state of the data in the SQUID memory storage to be read in response to the gate current.

2. The superconductor multi-state Josephson memory of claim 1, further comprising a single flux quantum counter connected to count the number of single flux quantum pulses from the memory cell to generate a memory output corresponding to the memory state of the data in the SQUID memory storage in response to the gate current.

3. The superconductor multi-state Josephson memory of claim 2, wherein the single flux quantum counter comprises an M-bit single flux quantum counter, M being an integer equal to $\log_2 N$.

4. The superconductor multi-state Josephson memory of claim 1, further comprising a digital-to-analog converter connected to convert the digital input data into the control current, the control current having a magnitude directly proportional to the digital input data and selected to cross the n current threshold boundaries, n being the memory state corresponding to the digital input data.

5. The superconductor multi-state Josephson memory of claim 4, wherein the digital-to-analog converter is directly connected to the control input.

6. The superconductor multi-state Josephson memory of claim 4, wherein the digital-to-analog converter is connected to provide the control current, the control current being inductively coupled to the SQUID memory storage.

7. The superconductor multi-state Josephson memory of claim 4, further comprising a single flux quantum counter connected to count the number of pulses from the memory cell to generate a memory output corresponding to the memory state of the data in the SQUID memory storage in response to the gate current, the single flux quantum counter connected to feed the memory output back to the digital-to-analog converter to regenerate the memory state in the SQUID memory storage, thereby forming a nondestructive readout.

8. A superconductor multi-state Josephson memory for storing multiple bits in a single memory cell, comprising:

(a) a plurality of memory cells arranged in a plurality of rows and columns, each memory cell comprising:

(i) a superconductive quantum interference device (SQUID) memory storage capable of storing data in N memory states, the SQUID memory storage characterized by a loop inductance L and a junction critical current $I_c$ and having a plurality of current threshold boundaries, the maximum number of memory states N equal to the maximum number of current threshold boundaries having an upper limit of $LI_c/\phi_0$, wherein $\phi_0$ is a constant representing the magnetic flux of a single flux quantum;

(ii) a control input connected to couple a control current to the SQUID memory storage to write digital input data as a memory state in the SQUID memory storage, the control current capable of being increased until n current threshold boundaries are crossed, n being an integer within the range of 0 to N−1 and representing the memory state of the data to be written, the control current then removed so that the SQUID memory storage supports a circulating current corresponding to n single flux quanta; and (iii) a gate connected to conduct a gate current to the SQUID memory storage, the gate current capable of being increased across the n current threshold boundaries to generate n pulses corresponding to the n single flux quanta, n representing the memory state of the data in the SQUID memory storage to be read in response to the gate current; and (b) a plurality of column select inputs and a plurality of row select inputs connected to address the memory cells individually.

9. The superconductor multi-state Josephson memory of claim 8, further comprising a single flux quantum counter connected to count the number of single flux quantum pulses from the memory cell to generate a memory output corresponding to the memory state of the data in the SQUID memory storage in response to the gate current.

10. The superconductor multi-state Josephson memory of claim 8, wherein the single flux quantum counter comprises an M-bit single flux quantum counter, M being an integer equal to $\log_2 N$.

11. The superconductor multi-state Josephson memory of claim 8, further comprising a digital-to-analog converter connected to convert the digital input data into the control current, the control current having a magnitude directly proportional to the digital input data and selected to cross the n current threshold boundaries, n being the memory state corresponding to the digital input data.

12. The superconductor multi-state Josephson memory of claim 11, wherein the digital-to-analog converter is directly connected to the control input.

13. The superconductor multi-state Josephson memory of claim 11, wherein the digital-to-analog converter is connected to provide the control current, the control current being inductively coupled to the SQUID memory storage.

14. The superconductor multi-state Josephson memory of claim 11, further comprising a single flux quantum counter connected to count the number of pulses from the memory cell to generate a memory output corresponding to the memory state of the data in the SQUID memory storage in response to the gate current, the single flux quantum counter connected to feed the memory output back to the digital-to-analog converter to regenerate the memory state in the SQUID memory storage, thereby forming a nondestructive readout.

15. The superconductor multi-state Josephson memory of claim 8, further comprising a plurality of SQUID switches each connected to activate one of the memory cells, each memory cell having a unique address identified by one of the column select inputs and one of the row select inputs, the SQUID switches connected to receive addressing signals from the column select inputs and the row select inputs.

16. The superconductor multi-state Josephson memory of claim 15, further comprising a plurality of digital-to-analog converters connected to convert the digital input data into the control current, the control current having a magnitude directly proportional to the digital input data and selected to cross the n current threshold boundaries, each digital-toanalog converter connected to inductively couple the control current to each column of memory cells.

17. The superconductor multi-state Josephson memory of claim 15, further comprising a plurality of single flux quantum counters, each counter connected to a column of memory cells to generate a count of single flux quantum pulses from a SQUID memory storage within the column, the count representing the memory state of the SQUID memory storage.

18. The superconductor multi-state Josephson memory of claim 17, further comprising:

a plurality of SQUID isolator-repeaters each connected to one of the memory cells, the SQUID isolator-repeaters connected in series forming a plurality of isolator-repeater columns corresponding to the columns of the memory cells, each of the isolator-repeater columns connected to one of the single flux quantum counters to generate a memory output, the isolator-repeaters connected to repeat the single flux quantum pulses such that the pulses are transmitted to the respective single flux quantum counters in response to the addressing signals from the column select inputs and row select inputs, and to prevent the pulses from entering into the SQUID memory storages.

19. A superconductor multi-state Josephson memory for storing multiple bits in a single memory cell, comprising:

(a) a plurality of memory cells arranged in a plurality of rows and columns, each memory cell comprising:

(i) a superconductive quantum interference device (SQUID) memory storage capable of storing data in N memory states, the SQUID memory storage characterized by a loop inductance L and a junction critical current $I_c$ and having a plurality of current threshold boundaries, the maximum number of memory states N equal to the maximum number of current threshold boundaries having an upper limit of $LI_c/\phi_0$, wherein $\phi_0$ is a constant representing the magnetic flux of a single flux quantum;

(ii) a control input connected to couple a control current to the SQUID memory storage to write digital input data as a memory state in the SQUID memory storage, the control current capable of being increased until n current threshold boundaries are crossed, n being an integer within the range of 0 to N−1 and representing the memory state of the data to be written, the control current then removed so that the SQUID memory storage supports a circulating current corresponding to n single flux quanta; and (iii) a gate connected to conduct a gate current to the SQUID memory storage, the gate current capable of being increased across the n current threshold boundaries to generate n pulses corresponding to the n single flux quanta, n representing the memory state of the data in the SQUID memory storage to be read in response to the gate current;

(b) a plurality of column select inputs and a plurality of row select inputs connected to address the memory cells individually;

(c) at least one single flux quantum counter connected to count the number of single flux quantum pulses from one of the memory cells in response to the gate current, the number of pulses representing the memory state of the data in the memory cell; and (d) at least one digital-to-analog converter connected to convert the digital input data into the control current, the control current having a magnitude directly proportional to the digital input data and selected to cross the n current threshold boundaries, n being the memory state corresponding to the digital input data.

20. The superconductor multi-state Josephson memory of claim 19, wherein the single flux quantum counter comprises an M-bit single flux quantum counter, M being an integer equal to $\log_2 N$.

21. The superconductor multi-state Josephson memory of claim 19, wherein the digital-to-analog converter is directly connected to the control input.

22. The superconductor multi-state Josephson memory of claim 19, wherein the digital-to-analog converter is connected to provide the control current, the control current being inductively coupled to the SQUID memory storage.

23. The superconductor multi-state Josephson memory of claim 19, wherein the single flux quantum counter connected to count the number of pulses from the memory cell to generate a memory output corresponding to the memory state of the data in the SQUID memory storage in response to the gate current, the single flux quantum counter connected to feed the memory output back to the digital-to-analog converter to regenerate the memory state in the SQUID memory storage, thereby forming a nondestructive readout.

24. The superconductor multi-state Josephson memory of claim 19, further comprising a plurality of SQUID switches each connected to activate one of the memory cells, each memory cell having a unique address identified by one of the column select inputs and one of the row select inputs, the SQUID switches connected to receive addressing signals from the column select inputs and the row select inputs.

25. A superconductive integrated circuit including a SQUID memory cell having paired Josephson junctions as part of an inductive loop having a plurality of current threshold boundaries, comprising:

(a) an input coupling a control current to the SQUID memory cell, the control current capable of being increased until a number of the current threshold boundaries are crossed and representing the memory state of the data to be written to the SQUID memory cell, and (b) gate means for conducting a gate current to the SQUID memory cell, the gate current capable of being increased across the current threshold boundaries to generate pulses corresponding to the memory state of the data in the SQUID memory cell to be read in response to the gate current.

26. The superconductive integrated circuit of claim 25, further comprising a single flux quantum counter connected to count the number of the pulses from the SQUID memory cell to generate a memory output corresponding to the memory state of the data in the SQUID memory cell.

27. The superconductive integrated circuit of claim 25, further comprising a digital-to-analog converter connected to convert the input into the control current, the control current having a magnitude directly proportional to the input and selected to cross the number of the current threshold boundaries corresponding to the memory state of the data to be written.

28. The superconductive integrated circuit of claim 27, wherein the control current is inductively coupled to the SQUID memory cell.

29. The superconductive integrated circuit of claim 25, wherein the SQUID memory cell is characterized by a loop inductance L and a junction critical current $I_c$, the maximum number of the memory states N equal to the maximum number of the current threshold boundaries having an upper limit of $LI_c/\phi_0$, wherein $\phi_0$ is a constant representing the magnetic flux of a single flux quantum.

* * * * *